US012697688B2

(12) United States Patent
Seyama et al.

(10) Patent No.: US 12,697,688 B2
(45) Date of Patent: Aug. 4, 2026

(54) SEMICONDUCTOR DEVICE MANUFACTURING APPARATUS AND MANUFACTURING METHOD

(71) Applicant: Yamaha Robotics Co., Ltd., Tokyo (JP)

(72) Inventors: Kohei Seyama, Tokyo (JP); Makoto Takahashi, Tokyo (JP)

(73) Assignee: Yamaha Robotics Co., Ltd., Tokyo (JP)

( * ) Notice: Subject to any disclaimer, the term of this patent is extended or adjusted under 35 U.S.C. 154(b) by 634 days.

(21) Appl. No.: 18/024,268

(22) PCT Filed: Sep. 2, 2020

(86) PCT No.: PCT/JP2020/033336
§ 371 (c)(1),
(2) Date: Mar. 1, 2023

(87) PCT Pub. No.: WO2022/049685
PCT Pub. Date: Mar. 10, 2022

(65) Prior Publication Data
US 2023/0268313 A1     Aug. 24, 2023

(51) Int. Cl.
*B23K 37/04* (2006.01)
*B23K 1/00* (2006.01)
(Continued)

(52) U.S. Cl.
CPC ........ *B23K 37/0408* (2013.01); *B23K 1/0016* (2013.01); *B23K 2101/40* (2018.08);
(Continued)

(58) Field of Classification Search
CPC .................... H01L 24/75; H01L 24/81; H01L 2224/75301; H01L 2224/75702;
(Continued)

(56) References Cited

U.S. PATENT DOCUMENTS

| 5,447,266 A | 9/1995 | Misono |
| 2020/0083193 A1* | 3/2020 | Sen ........................ H01L 24/75 |

FOREIGN PATENT DOCUMENTS

| JP | H06177179 | 6/1994 |
| JP | H06216201 | 8/1994 |

(Continued)

OTHER PUBLICATIONS

"International Search Report (Form PCT/ISA/210) of PCT/JP2020/033336", mailed on Nov. 24, 2020, with English translation thereof, pp. 1-5.

(Continued)

*Primary Examiner* — Julio J Maldonado
*Assistant Examiner* — Jason Mcdonald
(74) *Attorney, Agent, or Firm* — JCIPRNET

(57)     ABSTRACT

A semiconductor device manufacturing device comprises: a stage; two bonding heads which are mutually independently horizontally movable; and a controller for causing each of the two bonding heads to perform a positioning process for horizontal positioning, a grounding process for lowering the chip until the chip is grounded on a substrate, and a pressurizing process for applying a bonding load to the chip that is grounded. The controller causes the two bonding heads to perform the positioning process and the grounding process independently from each other in a non-pressurizing period in which neither of the bonding heads is performing the pressurizing process, and causes the two bonding heads after completing the positioning process and the grounding process to perform the pressurizing process in parallel.

1 Claim, 7 Drawing Sheets

(51) Int. Cl.
  B23K 101/40 (2006.01)
  H10W 72/00 (2026.01)
(52) U.S. Cl.
  CPC  *H10W 72/07141* (2026.01); *H10W 72/07178*
    (2026.01); *H10W 72/072* (2026.01); *H10W*
    *72/07232* (2026.01)
(58) Field of Classification Search
  CPC .. H01L 2224/75745; H01L 2224/8118; H10W
    72/0711; H10W 72/072; H10W 72/07141;
    H10W 72/07178
  See application file for complete search history.

(56)        References Cited

FOREIGN PATENT DOCUMENTS

| | | | | |
|---|---|---|---|---|
| JP | 2002324821 | 11/2002 | | |
| JP | 2002368021 | 12/2002 | | |
| JP | 2004303757 | 10/2004 | | |
| JP | 2011040489 | 2/2011 | | |
| JP | 2012028587 | 2/2012 | | |
| WO | 2014157134 | 10/2014 | | |
| WO | WO-2014157134 A1 * | 10/2014 | ............. | H01L 24/97 |

OTHER PUBLICATIONS

"Office Action of Taiwan Counterpart Application", issued on Sep. 5, 2022, with part of English translation thereof, p. 1-p. 15.
"Notice of Reasons for Refusal of Taiwan Counterpart Application", issued on Jan. 30, 2023, with part of English translation thereof, p. 1-p. 9.

* cited by examiner (a)

(b)

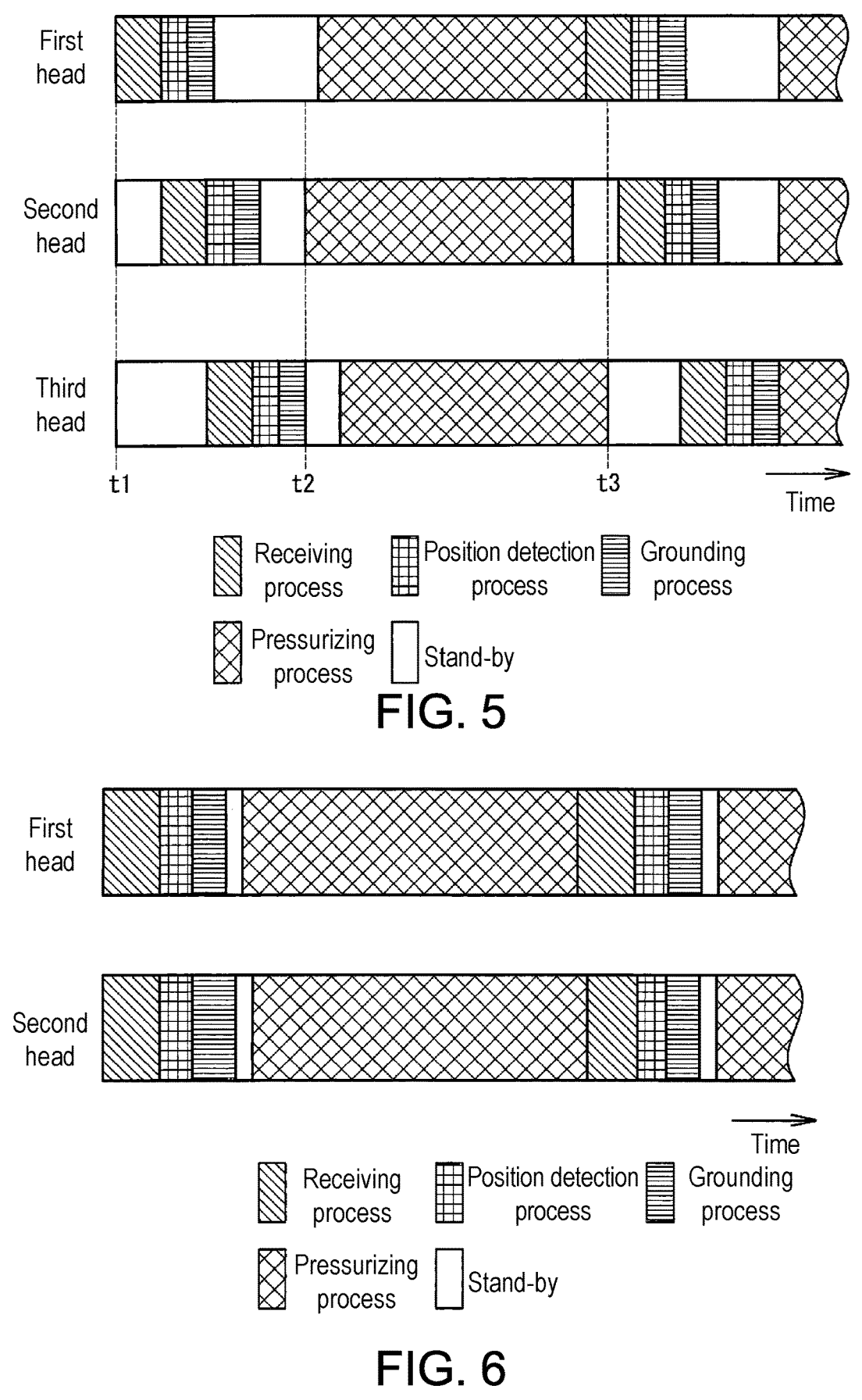

First head

Second head

Third head t1          t2                    t3

Time

| Receiving process | Position detection process | Grounding process |

| Pressurizing process | Stand-by |

FIG. 5

First head

Second head

Time

| Receiving process | Position detection process | Grounding process |

| Pressurizing process | Stand-by |

SEMICONDUCTOR DEVICE MANUFACTURING APPARATUS AND MANUFACTURING METHOD

CROSS-REFERENCE TO RELATED APPLICATION

This application is a 371 application of the International PCT application serial no. PCT/JP2020/033336, filed on Sep. 2, 2020. The entirety of the above-mentioned patent application is hereby incorporated by reference herein and made a part of this specification.

TECHNICAL FIELD

The specification discloses a semiconductor device manufacturing device including multiple bonding heads, and a semiconductor device manufacturing method using the manufacturing device.

RELATED ART

Conventionally, there has been known a semiconductor device manufacturing device that includes a stage on which a substrate is placed and a bonding head that holds a chip, and drives the bonding head to press and bond the chip to the substrate. Some of such semiconductor device manufacturing devices include multiple bonding heads in order to improve chip bonding efficiency. In a multiple-head manufacturing device, normally, while some bonding heads are executing a pressurizing process to press the chip against the substrate, other bonding heads execute other processes, such as a positioning process for horizontally positioning the bonding head in the horizontal direction, a grounding process to ground the chip to the substrate, and the like. With such a configuration, the stand-by time of the bonding head may be reduced, and the efficiency of the bonding process may be improved.

CITATION LIST

Patent Literature

[Patent Literature 1] Japanese Patent Laid-Open No. H06-216201
[Patent Literature 2] Japanese Patent Laid-Open No. 2002-324821

SUMMARY

Technical Problem

However, if the positioning process or the grounding process is executed by other bonding heads while the pressurizing process is being executed by some of the bonding heads, there is a risk that the positional accuracy of the chip may be impaired. That is, in the pressurizing process, the bonding head applies a large load to the stage, and the stage receives this load and bends. When the stage bends, the horizontal position of the electrode provided on the substrate shifts from its original horizontal position. In this case, there arise a problem that an accurate horizontal position of the electrode may not be detected, and a problem that the relative position between the electrode and the chip is shifted even if the bonding head is positioned at the original horizontal position.

In addition, Patent Literature 1 discloses a technique in which, while two film carriers (corresponding to chips) are pressed against a display device by two thermocompression bonding elements (corresponding to bonding heads), another two thermocompression elements make another two film carriers grounded to start pressing. In the case of such a technique, as described above, there is a risk of positional shift due to bending of the stage.

Further, Patent Literature 2 discloses a technique of simultaneously pressing multiple chips with multiple compression-bonding tools. However, the compression-bonding tool of Patent Literature 2 presses a chip that has been temporarily bonded to a substrate in advance, that is, a chip that has been placed at an appropriate position, but there is no description of how to place the chip at an appropriate position.

As described above, according to the conventional technique, there is a risk that the positional accuracy of the chip may decrease due to the bending of the stage. Therefore, this specification discloses a semiconductor device manufacturing device and a manufacturing method capable of further improving the positional accuracy of the chip.

Solution to Problem

A semiconductor device manufacturing device according to this specification includes: a stage on which a substrate is to be placed; multiple bonding heads movable in a horizontal direction independently of each other and each having a bonding tool holding a chip and movable in a vertical direction; and a controller for causing each of the multiple bonding heads to execute a positioning process for horizontal positioning, a grounding process for lowering the chip until the chip is grounded to the substrate or another chip, and a pressurizing process for applying a bonding load to the chip that is grounded. During a non-pressurizing period in which none of the bonding heads is executing the pressurizing process, the controller causes the multiple bonding heads to execute the positioning process and the grounding process independently of each other, and causes at least two bonding heads that have completed the positioning process and the grounding process to execute the pressurizing process in parallel such that their execution periods at least partially overlap.

In this case, the controller may cause the at least two bonding heads to stand by in a grounded state until the grounding process by other bonding heads is completed after the grounding process of each of the at least two bonding heads is completed.

In addition, the semiconductor device manufacturing device may further include: one pick-up unit that sequentially supplies new chips to the multiple bonding heads, and the controller may stagger execution timings of receiving processes of the multiple bonding heads so that execution times of the receiving processes for receiving new chips by the multiple bonding heads do not overlap each other.

In addition, the semiconductor device manufacturing device may further include: multiple pick-up units provided corresponding to each of the multiple bonding heads and supplying new chips to the corresponding bonding heads, and the controller may cause each of the multiple bonding heads to execute a receiving process for receiving a new chip, the positioning process, the grounding process, and the pressurizing process in parallel, and may provide a predetermined stand-by time between the grounding process and the pressurizing process.

A semiconductor device manufacturing method according to this specification is a semiconductor device manufacturing method for manufacturing a semiconductor device by bonding a chip to a substrate placed on a stage, and includes: executing, by each of multiple bonding heads movable in a horizontal direction independently of each other and each having a bonding tool holding a chip and movable in a vertical direction, a receiving step for receiving a new chip, a positioning step for horizontal positioning, a grounding step for lowering the chip until the chip is grounded to the substrate or another chip, and a pressurizing step for applying a bonding load to the chip that is grounded; executing, by the multiple bonding heads, the positioning step and the grounding step independently of each other during a non-pressurizing period in which none of the bonding heads is executing the pressurizing step; and executing, by at least two bonding heads that have completed the positioning step and the grounding step, the pressurizing step in parallel so that their execution periods at least partially overlap.

Effects of Invention

According to the technology disclosed in this specification, it is possible to further improve the positional accuracy of the chip.

BRIEF DESCRIPTION OF THE DRAWINGS

FIG. 5 is a diagram showing another example of a timing chart of the bonding process.

FIG. 6 is a diagram showing another example of a timing chart of the bonding process.

DESCRIPTION OF THE EMBODIMENTS

Figure 1:
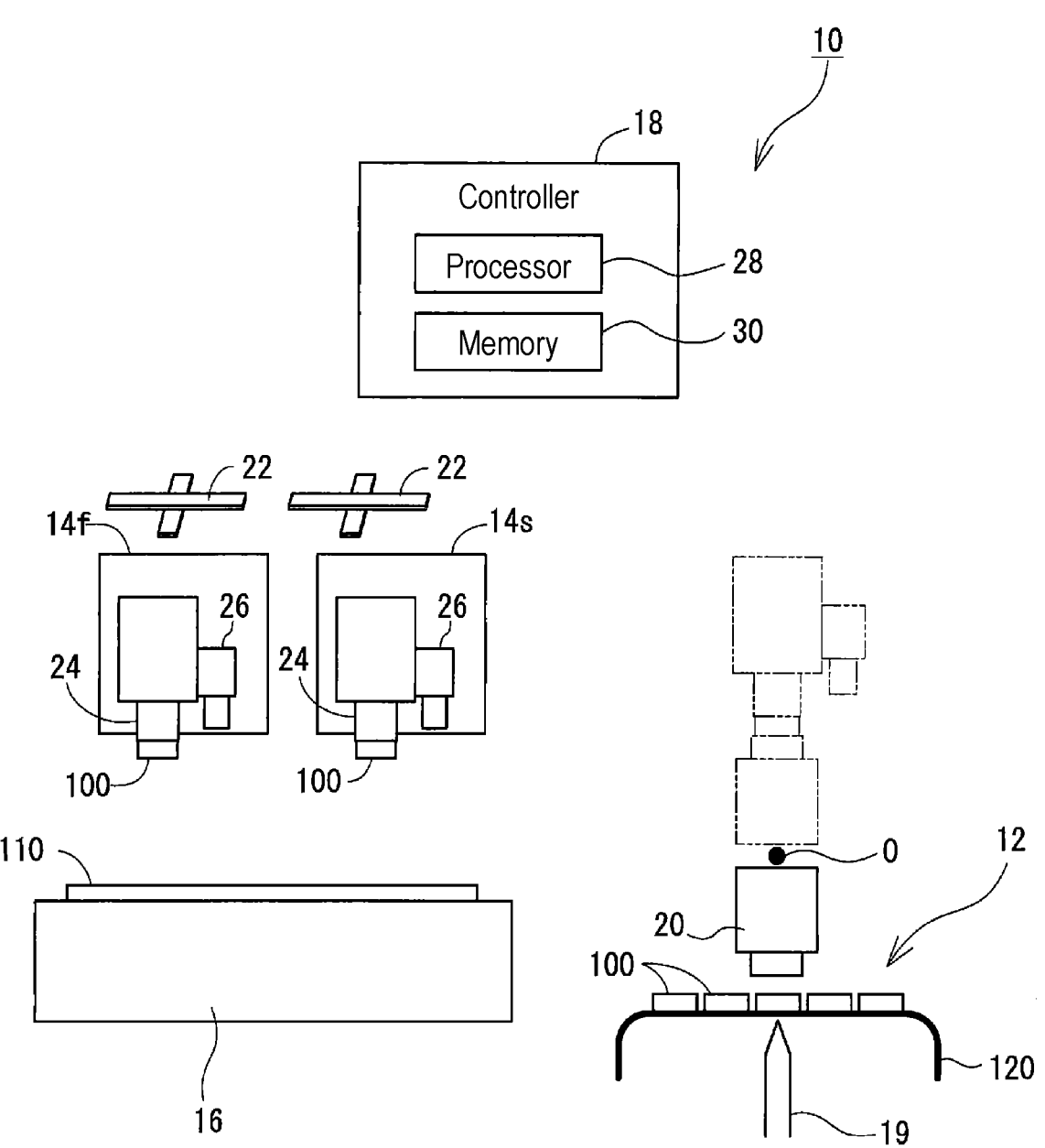
FIG. 1 is a schematic diagram showing a configuration of the manufacturing device.

A configuration of a semiconductor device manufacturing device 10 will be described below with reference to the drawings. FIG. 1 is a schematic diagram showing a configuration of the manufacturing device 10. This manufacturing device 10 manufactures a semiconductor device by bonding multiple semiconductor chips 100 to a substrate 110.

The manufacturing device 10 includes a pick-up unit 12, two bonding heads 14$f$ and 14$s$, a stage 16, and a controller 18. The pick-up unit 12 includes a push-up pin 19 that pushes up the semiconductor chip 100 placed on a dicing tape 120, and a pick-up head 20 that holds the pushed-up semiconductor chip 100 on its bottom surface. The pick-up head 20 is rotatable around a rotation axis O extending in the horizontal direction. By rotating the pick-up head 20 by 180 degrees, the picked-up semiconductor chip 100 may be reversed by 180 degrees in the thickness direction. As a result, the surface of the semiconductor chip 100 that has been adhered to the dicing tape 120 faces upward.

The substrate 110 is placed on the stage 16. A suction mechanism for sucking and holding the substrate 110, a heater for heating the substrate 110, and the like are incorporated inside the stage 16. Multiple electrodes (not shown) electrically and mechanically connected to the semiconductor chip 100 are formed on the surface of the substrate 110.

The two bonding heads 14$f$ and 14$s$ are provided above the stage 16. In the following description, one of the two bonding heads is called the "first head 14$f$" and the other is called the "second head 14$s$." Also, when there is no need to distinguish between the two, the additional alphabet is omitted and the term "bonding head 14" is used.

The first head 14$f$ and the second head 14$s$ have basically the same structure; that is, each bonding head 14 is connected to a corresponding XY table 22 and is movable independently of each other in the horizontal direction parallel to the upper surface of the stage 16. Each bonding head 14 also includes a bonding tool 24, an elevating mechanism, and a head camera 26. The bonding tool 24 holds the semiconductor chip 100 by suction, and is movable in the vertical direction by the elevating mechanism. By lowering the bonding tool 24 toward the substrate 110, the semiconductor chip 100 is grounded and pressed to the substrate 110. The bonding tool 24 is also provided with a heater for heating the semiconductor chip 100 it holds.

The head camera 26 is attached to the bonding head 14 with the optical axis extending downward, and captures an image of the substrate 110 and the like placed on the stage 16. The controller 18 calculates the relative positional relationship between the bonding head 14 and the substrate 110 based on the image captured by the head camera 26 and the like, and positions the bonding head 14 based on the calculation result.

The controller 18 controls driving of each part of the manufacturing device 10. The controller 18 is physically a computer including a processor 28 and a memory 30. This "computer" also includes a microcontroller that incorporates a computer system into a single integrated circuit. In addition, the processor 28 refers to a processor in a broad sense, and includes a general-purpose processor, such as a central processing unit (CPU) and the like, and a dedicated processor, such as a graphics processing unit (GPU), an application specific integrated circuit (ASIC), a field programmable gate array (FPGA), a programmable logic device, and the like. In addition, the operation of the processor 28 described below may be executed not only by one processor but also by the cooperation of multiple processors existing at physically separated positions. Similarly, the memory 30 does not need to be physically one element, and may be composed of multiple memories existing at physically separated positions. The memory 30 may also include at least one of semiconductor memory (such as a RAM, a ROM, a solid state drive, and the like) and magnetic disk (such as a hard disk drive and the like).

When manufacturing a semiconductor device, bonding terminals (such as bumps, not shown) provided on the bottom surface of the semiconductor chip 100 are bonded to electrodes (not shown) formed on the surface of the substrate 110. In this example, the bonding terminals are bonded to the electrodes of the substrate 110 by thermal compression bonding (TCB). TCB is a technique in which the bonding terminals of the semiconductor chip 100 are compression-bonded to the electrodes of the substrate 110 under high pressure at a temperature below the melting point of each, and are primitively bonded using the diffusion of atoms occurring between the bonding surfaces. In the case of TCB, the bonding load Fb applied to the semiconductor chip 100 is relatively large, and the pressurizing process time for pressing the semiconductor chip 100 against the substrate 110 by the bonding head 14 is relatively long.

Here, in this example, the pressurizing process by the second head 14s is executed in parallel with the pressurizing process by the first head 14f. In addition, the execution timing of each process of the two bonding heads 14f and 14s is adjusted so that the positioning accuracy of one of the bonding heads 14s and 14f does not decrease due to the pressurizing process by the other of the bonding heads 14f and 14s.

Figure 2:
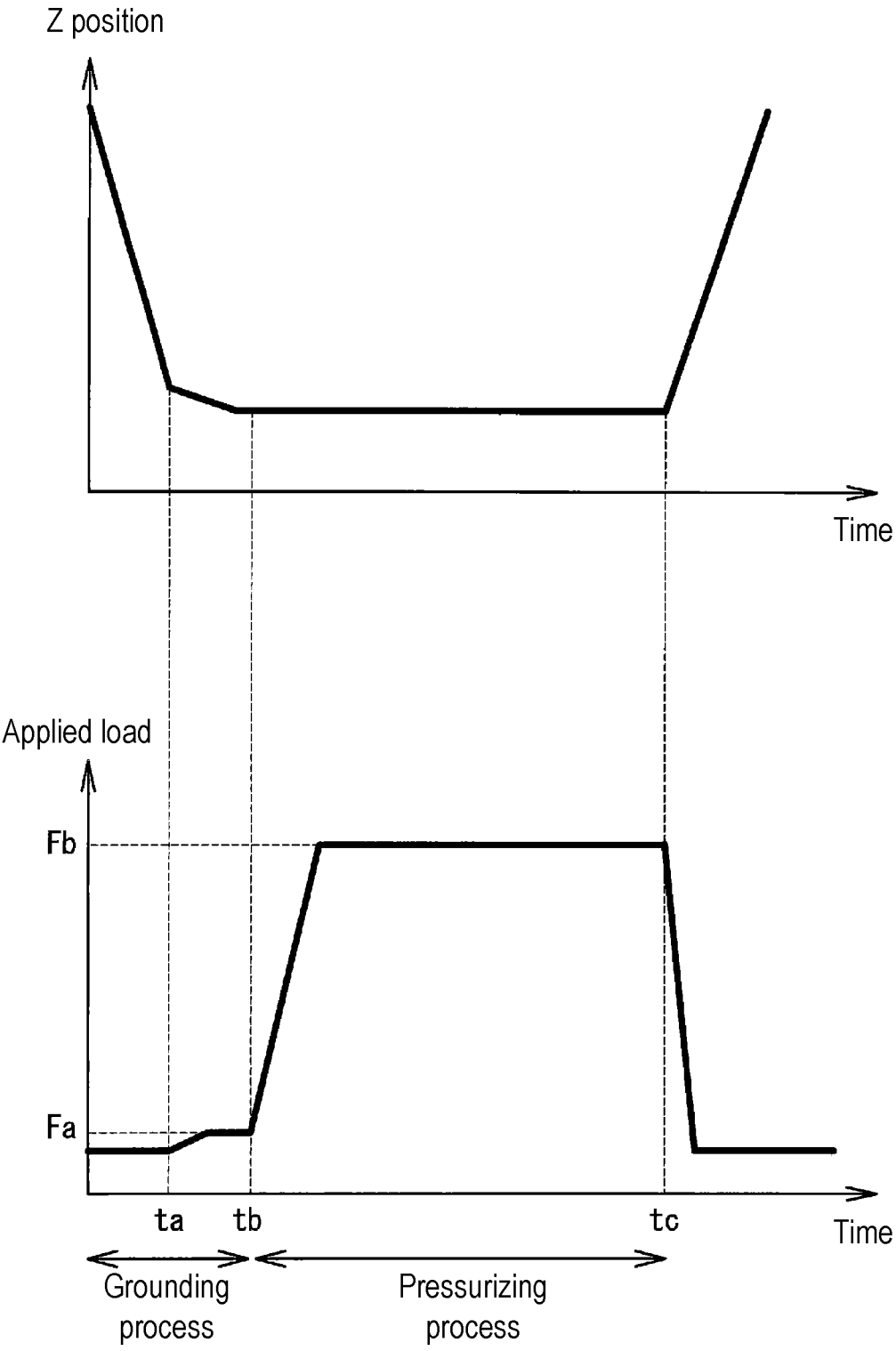
FIG. 2 is a graph showing the transition of the position of the bonding tool and the applied load in the grounding process and the pressurizing process.
Figure 3:
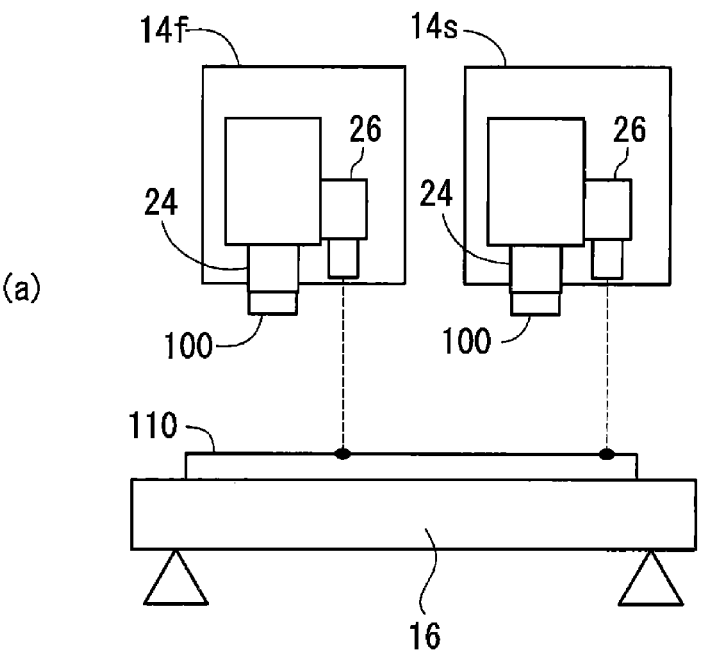
FIG. 3 is an image diagram showing the bonding process.
Figure 3:
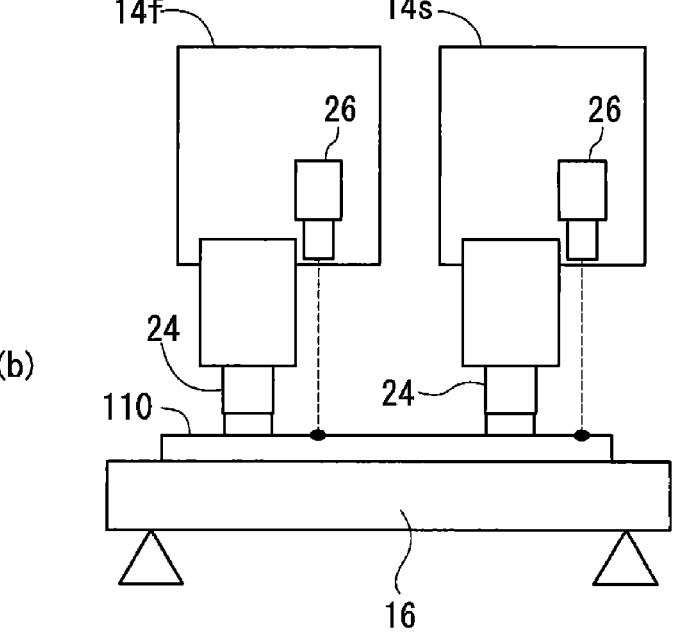
Figure 4:
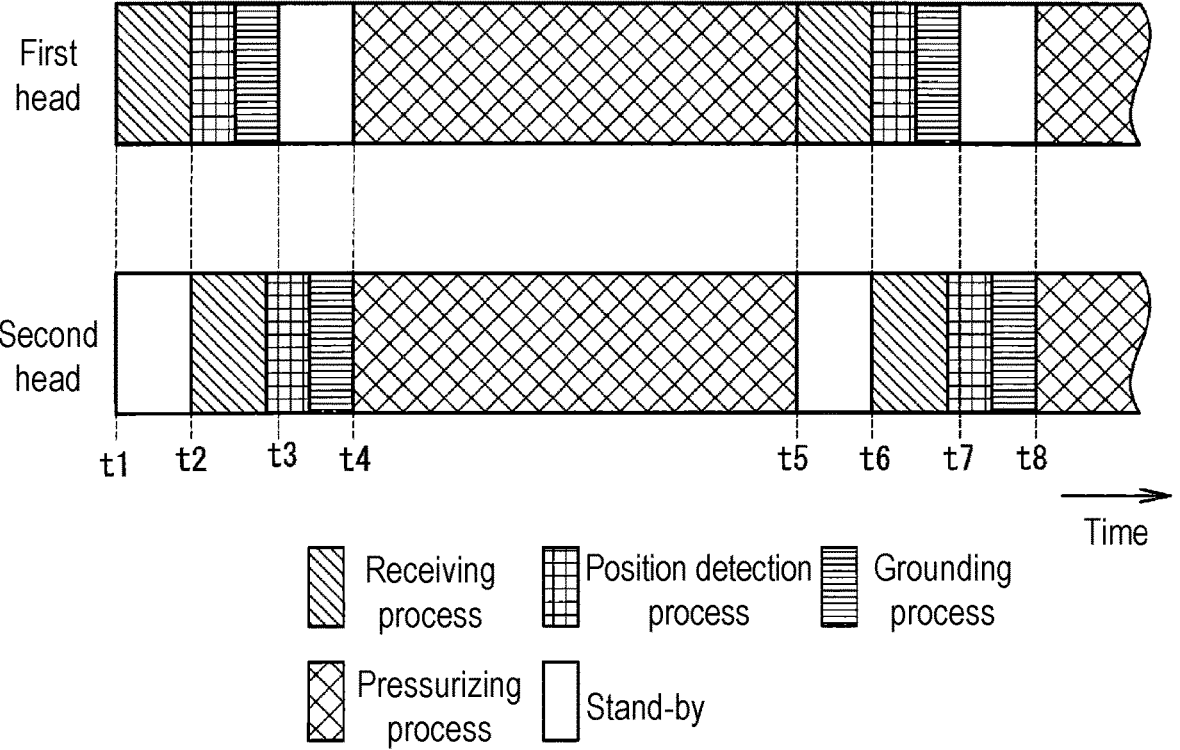
FIG. 4 is a diagram showing an example of a timing chart of the bonding process.
Figure 7:
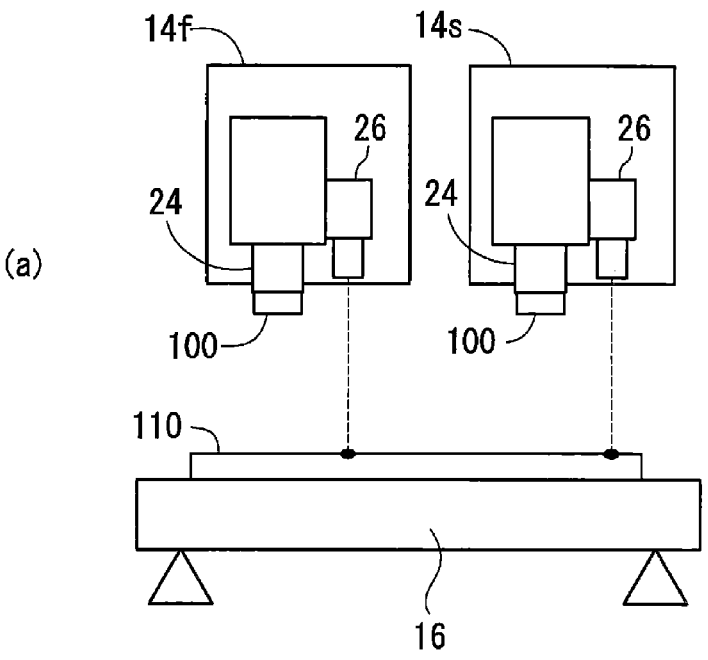
FIG. 7 is an image diagram showing a bonding process of the comparative example.
Figure 7:
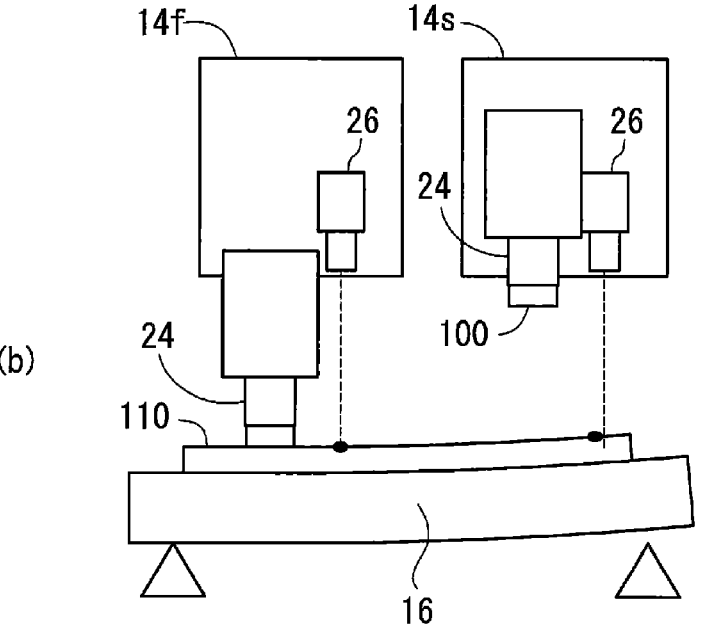
Figure 8:
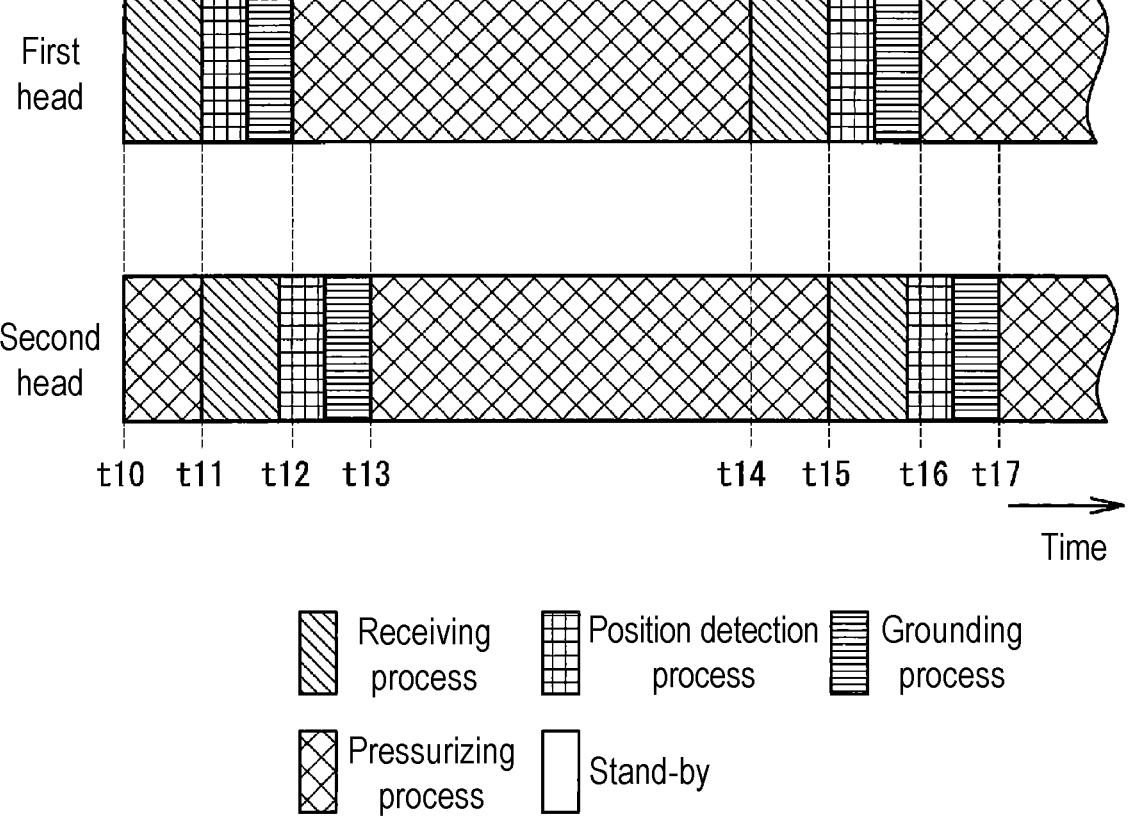
FIG. 8 is a diagram showing an example of a timing chart of the bonding process of the comparative example.

This will be described by comparing the comparative example and this example. FIG. 2 is a graph showing the transition of the position of the bonding tool 24 and the applied load in the grounding process and the pressurizing process. FIG. 3 is an image diagram showing the bonding process of this example. FIG. 4 is a diagram showing an example of a timing chart of the bonding process of this example. Further, FIG. 7 is an image diagram showing a bonding process of the comparative example. FIG. 8 is a diagram showing an example of a timing chart of the bonding process of the comparative example. The comparative example is a process focused on shortening the process time of the bonding process.

In the bonding process for bonding the semiconductor chip 100 to the substrate 110, the controller 18 causes each bonding head 14 to sequentially execute a receiving process, a positioning process, a grounding process, and a pressurizing process. The receiving process is a process of receiving a new semiconductor chip 100 from the pick-up unit 12. When the receiving process is completed, the controller 34 executes the positioning process for positioning the bonding tool 24 in the horizontal direction so that the bonding terminals of the semiconductor chip 100 held by the bonding tool 24 are positioned directly above the corresponding electrodes of the substrate 110. In this positioning process, as shown in (a) of FIG. 3 or (a) of FIG. 7, an image of the substrate 110 is captured by the head camera 26, and the horizontal position of the bonding head 14 relative to the substrate 110 is obtained based on the obtained captured image.

When the positioning process is completed, the controller 34 lowers the bonding tool 24 and executes the grounding process of grounding the semiconductor chip 100 to the substrate 110, as shown in (b) of FIG. 3 or (b) of FIG. 7. Then, when the grounding process is completed, the controller 34 executes the pressurizing process to apply a predetermined bonding load Fb to the semiconductor chip 100 with the bonding tool 24. By applying this bonding load Fb, the bonding terminals of the semiconductor chip 100 are bonded to the electrodes of the substrate 110. When applying the load, the substrate 110 and the semiconductor chip 100 may be heated to a temperature lower than the melting temperature of the electrodes and bonding terminals by the heater provided on the stage 16 and the bonding tool 24.

The grounding process and pressurizing process will be described in more detail with reference to FIG. 2. The upper part of FIG. 2 shows the transition of the Z position of the bonding tool 24 during the grounding process and the pressurizing process, and the lower part of FIG. 2 shows the transition of the applied load during the grounding process and the pressurizing process. As shown in FIG. 2, in the grounding process, the bonding tool 24 is lowered toward the substrate 110. At time ta, when the semiconductor chip 100 starts contacting the substrate 110, the load gradually increases. When the displacement of the bonding tool 24 stops while a predetermined grounding load Fa is applied to the semiconductor chip 100, it is determined that the grounding is completed. In the example of FIG. 2, it is determined that grounding is completed at time tb. When the grounding is completed, the controller 18 drives the elevating mechanism provided in the bonding head 14 to start the pressurizing process to apply a predetermined bonding load Fb to the semiconductor chip 100. At time tc after a certain period of time has passed since this pressurizing, the controller 34 raises the bonding tool 24 and ends the pressurizing process.

Here, in this example, two bonding heads 14 are provided, but only one pick-up unit 12 is provided. In this case, of course, the receiving process by the first head 14f and the receiving process by the second head 14s cannot be executed in parallel. In such a case, if priority is given to shortening the process time, as in the comparative example shown in FIG. 8, during the execution period t10 to t11 of the receiving process by the first head 14f, the second head 14s may execute processes other than the receiving process (pressurizing process in the illustrated example), and during the execution period t11 to t12 of the receiving process by the second head 14s, the first head 14f may execute processes other than the receiving process (positioning process and grounding process in the illustrated example). With such a configuration, it is possible to eliminate the stand-by time in which the bonding head 14 stands by without executing any process, thereby shortening the time required for manufacturing the semiconductor device.

However, in the configuration of the comparative example, there is a possibility that the positioning accuracy of one bonding head 14 may decrease due to the pressurizing process executed by the other bonding head 14. That is, in the comparative example, as shown in FIG. 8, during the period (t12 to t14) in which the first head 14f is executing the pressurizing process, the second head 14s executes the positioning process (grid hatched area) and the grounding process (horizontal hatched area). In the pressurizing process, as described above, a relatively large bonding load Fb is applied to the substrate 110 and thus the stage 16. As a result, the stage 16 and the substrate 110 may be bent around the pressing point, as shown in (b) of FIG. 7. When the stage 16 is bent, the horizontal position of the second head 14s relative to the substrate 110 shifts compared to when the stage 16 is horizontal. Therefore, when the positioning process or grounding process is executed by the second head 14s while the stage 16 is bent due to the pressurizing process of the first head 14f, the semiconductor chip 100 held by the second head 14s cannot be grounded at an appropriate position, and the positional accuracy of chip bonding decreases.

Therefore, in this example, the execution period of the pressurizing process of the first head 14f and the execution period of the pressurizing process of the second head 14s are at least partially overlapped, and the positioning process and the grounding process are allowed only during the non-pressurizing period when none of the bonding heads 14 is executing the pressurizing process. That is, as shown in FIG. 4, even if the grounding process is completed at time t3, the first head 14f stands by without starting the pressurizing process until time t4 when the grounding process of the second head 14s is completed. Then, after time t4 when the second head 14s completes the grounding process, the first head 14f starts the pressurizing process. In other words, in this example, during the execution period (t4 to t5) of the pressurizing process of the first head 14f, the positioning process and grounding process of the second head 14s are not executed, and during the execution period (t4 to t5) of the pressurizing process of the second head 14s, the positioning process and grounding process of the first head 14*f* are not executed. With such a configuration, the stage 16 does not bend due to the pressurizing process during the execution of the positioning process and the grounding process; therefore, the positioning and grounding may be executed accurately, and the positional accuracy of chip bonding may be improved.

In addition, in the case of TCB, the time required for the pressurizing process is several to dozens of times longer than the time required from the receiving process to the completion of the grounding process. By executing such a long pressurizing process in parallel with multiple bonding heads 14, the stand-by time of the bonding heads 14 may be shortened, and the increase in the time required for manufacturing the semiconductor device may be suppressed. In addition, in the example of FIG. 4, the pressurizing process of the first head 14*f* and the pressurizing process of the second head 14*s* are started simultaneously. However, the start timing of the pressurizing process of the two bonding heads 14 does not have to be simultaneous as long as the grounding process of both the first head 14*f* and the second head 14*s* is completed. That is, once the semiconductor chip 100 is grounded at an appropriate position, even if the stage 16 is bent afterward, the positional shift is unlikely to occur. Therefore, as long as the other bonding head 14 starts the pressurizing process after the grounding, there is little problem even if the stage 16 is bent; therefore, the start timing of the pressurizing process of the two bonding heads 14 does not have to match. However, since it is desirable that the load applied to the stage 16 is less biased, it is desirable that the two bonding heads 14 start the pressurizing process at approximately the same timing.

In any case, according to the semiconductor device manufacturing device 10 disclosed in this specification, the positional accuracy of the semiconductor chip 100 may be further improved. The configuration described so far is only an example, other configurations may be changed as appropriate, as long as during the non-pressurizing period in which none of the bonding heads 14 is executing the pressurizing process, multiple bonding heads 14 are caused to execute the positioning process and the grounding process independently of each other, and at least two bonding heads 14 that have completed the positioning process and the grounding process are caused to execute the pressurizing process in parallel such that their execution periods at least partially overlap.

For example, the number of bonding heads 14 provided in one manufacturing device 10 is not limited to two, and may be more. FIG. 5 is an example of a timing chart when one manufacturing device 10 has three bonding heads 14. In the example of FIG. 5, after the time t2 at which all the three bonding heads 14 completed the grounding process, the pressurizing process of each bonding head 14 is started. Further, as shown in FIG. 5, the start timings of the pressurizing process of the multiple bonding heads 14 do not need to be simultaneous, and may be staggered.

Also, in the above example, only one pick-up unit 12 for transferring a new semiconductor chip 100 is provided to the bonding head 14, but the same number of pick-up units 12 as the bonding heads 14 may be provided. FIG. 6 is an example of a timing chart when two pick-up units 12 and two bonding heads 14 are provided. In this case, the pick-up units 12 each supply a new semiconductor chip 100 to the corresponding bonding head 14. In such a configuration, the two bonding heads 14 may execute the receiving process in parallel, and the subsequent positioning process, grounding process, and pressurizing process may be started at substantially the same timing. However, it is difficult to completely match the execution time of each process in the multiple bonding heads 14, and the end timing of the grounding process is slightly different. Therefore, as shown in FIG. 6, a predetermined stand-by time (white area) may be provided between the grounding process and the pressurizing process. By providing such a stand-by time, it is possible to absorb the difference of the end timing of the grounding process by the stand-by time, and each bonding head 14 may proceed with the process without considering the progress of the other bonding heads 14. As a result, control of the multiple bonding heads 14 may be simplified. Further, in the above description, the case where the semiconductor chip 100 is bonded to the substrate 110 has been described as an example, but the technique disclosed in this specification may be applied when bonding one semiconductor chip 100 on another semiconductor chip 100.

What is claimed is:

1. A semiconductor device manufacturing method for manufacturing a semiconductor device by bonding a chip to a substrate placed on a stage, comprising:

executing, by each of a plurality of bonding heads movable in a horizontal direction independently of each other and each having a bonding tool holding a chip and movable in a vertical direction, a positioning step for horizontal positioning, a grounding step for lowering the chip until the chip is grounded to the substrate or another chip, and a pressurizing step for applying a bonding load to the chip that is grounded;

executing, by the plurality of bonding heads, the positioning step and the grounding step independently of each other during a non-pressurizing period in which none of the bonding heads is executing the pressurizing step;

providing, by a controller, a predetermined stand-by time set in advance based on a difference of end timings of the grounding steps among the plurality of bonding heads;

executing, by at least two bonding heads that have completed the positioning step and the grounding step, the pressurizing step in parallel so that their execution periods at least partially overlap; and staggering execution timings of receiving processes so that execution times of the receiving processes for receiving new chips by the plurality of bonding heads do not overlap each other.

\* \* \* \* \*